(12) United States Patent
Brockhaus et al.

(10) Patent No.: US 9,627,341 B2
(45) Date of Patent: Apr. 18, 2017

(54) WAFER ARRANGEMENT, A METHOD FOR TESTING A WAFER, AND A METHOD FOR PROCESSING A WAFER

(71) Applicant: Infineon Technologies Dresden GmbH, Dresden (DE)

(72) Inventors: Peter Brockhaus, Dresden (DE); Uwe Koeckritz, Dresden (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 14/064,271

(22) Filed: Oct. 28, 2013

(65) Prior Publication Data

US 2015/0115444 A1   Apr. 30, 2015

(51) Int. Cl.
| | | |
|---|---|---|
| *H01L 33/56* | (2010.01) | |
| *H01L 23/00* | (2006.01) | |
| *G01R 31/28* | (2006.01) | |
| *H01L 21/683* | (2006.01) | |
| *H01L 21/66* | (2006.01) | |

(52) U.S. Cl.
CPC .......... *H01L 24/27* (2013.01); *G01R 31/2831* (2013.01); *H01L 21/6835* (2013.01); *H01L 24/19* (2013.01); *H01L 21/6836* (2013.01); *H01L 22/14* (2013.01); *H01L 24/06* (2013.01); *H01L 24/08* (2013.01);
(Continued)

(58) Field of Classification Search
CPC ......... H01L 21/02002; H01L 21/02005; H01L 21/02038; H01L 21/2007; H01L 21/67; H01L 21/67236; H01L 21/67763; H01L 21/682; H01L 21/68707; H01L 21/68714; H01L 22/22; H01L 22/34; H01L 24/94; H01L 24/96; H01L 27/14632; H01L 33/0079; H01L 2221/67
See application file for complete search history.

(56) References Cited

U.S. PATENT DOCUMENTS

| | | | | |
|---|---|---|---|---|
| 5,904,499 A | * | 5/1999 | Pace | ...................... H01L 23/053 257/E21.511 |
| 8,106,516 B1 | * | 1/2012 | Lacap | ..................... H01L 23/50 257/666 |

(Continued)

OTHER PUBLICATIONS http://multimedia.3m.com/mws/mediawebserver?mwsId=66666U F6EVsSyXTtnXMyM8T6EVtQEVs6EVs6EVs6E666666--&fn=SolidStateTechWSSFeb10.pdf Richard Webb: SolidState Echnology, Feb. 2010 edition of Solid State Technology, PennWell Corporation, 4 pages.
(Continued)

*Primary Examiner* — Earl Taylor
*Assistant Examiner* — Samuel Park

(57) ABSTRACT

According to various embodiments, a wafer arrangement may be provided, the wafer arrangement may include: a wafer including at least one electronic component having at least one electronic contact exposed on a surface of the wafer; an adhesive layer structure disposed over the surface of the wafer, the adhesive layer structure covering the at least one electronic contact; and a carrier adhered to the wafer via the adhesive layer structure, wherein the carrier may include a contact structure at a surface of the carrier aligned with the at least one electronic contact so that by pressing the wafer in direction of the carrier, the contact structure can be brought into electrical contact with the at least one electronic contact of the at least one electronic component.

11 Claims, 6 Drawing Sheets

(52) U.S. Cl.
CPC ............... *H01L 2221/6834* (2013.01); *H01L 2221/68318* (2013.01); *H01L 2221/68327* (2013.01); *H01L 2221/68381* (2013.01); *H01L 2224/0401* (2013.01); *H01L 2224/0603* (2013.01); *H01L 2224/06181* (2013.01); *H01L 2224/08112* (2013.01); *H01L 2224/25175* (2013.01); *H01L 2224/27009* (2013.01); *H01L 2224/495* (2013.01); *H01L 2924/12042* (2013.01); *H01L 2924/13055* (2013.01); *H01L 2924/15788* (2013.01)

(56) References Cited

U.S. PATENT DOCUMENTS

| | | | |
|---|---|---|---|
| 2009/0291524 A1* | 11/2009 | Takahashi | H01L 21/56 438/108 |
| 2011/0159639 A1* | 6/2011 | Yee | H01L 21/568 438/109 |
| 2011/0186973 A1* | 8/2011 | Pagaila | H01L 23/552 257/660 |
| 2011/0215457 A1* | 9/2011 | Park | H01L 23/3677 257/686 |

OTHER PUBLICATIONS http://www.schott.com/epackaging/german/auto/others/hermes.html Schott Hermes: Product flyer, NEC SCHOTT Components Corporation, 1 page.

http://www.yushinamerica.com/en/robotic-accessories/specialized-equipment/wss-equipment-detail Yushin WSS Demounter, Yushin Precision Equipment Co., Ltd, 1 page.

http://www.disco.co.jp/eg/solution/library/taiko.html TAIKO Process, Disco Corporation, Nov. 4, 2013, 3 pages.

* cited by examiner

FIG. 6

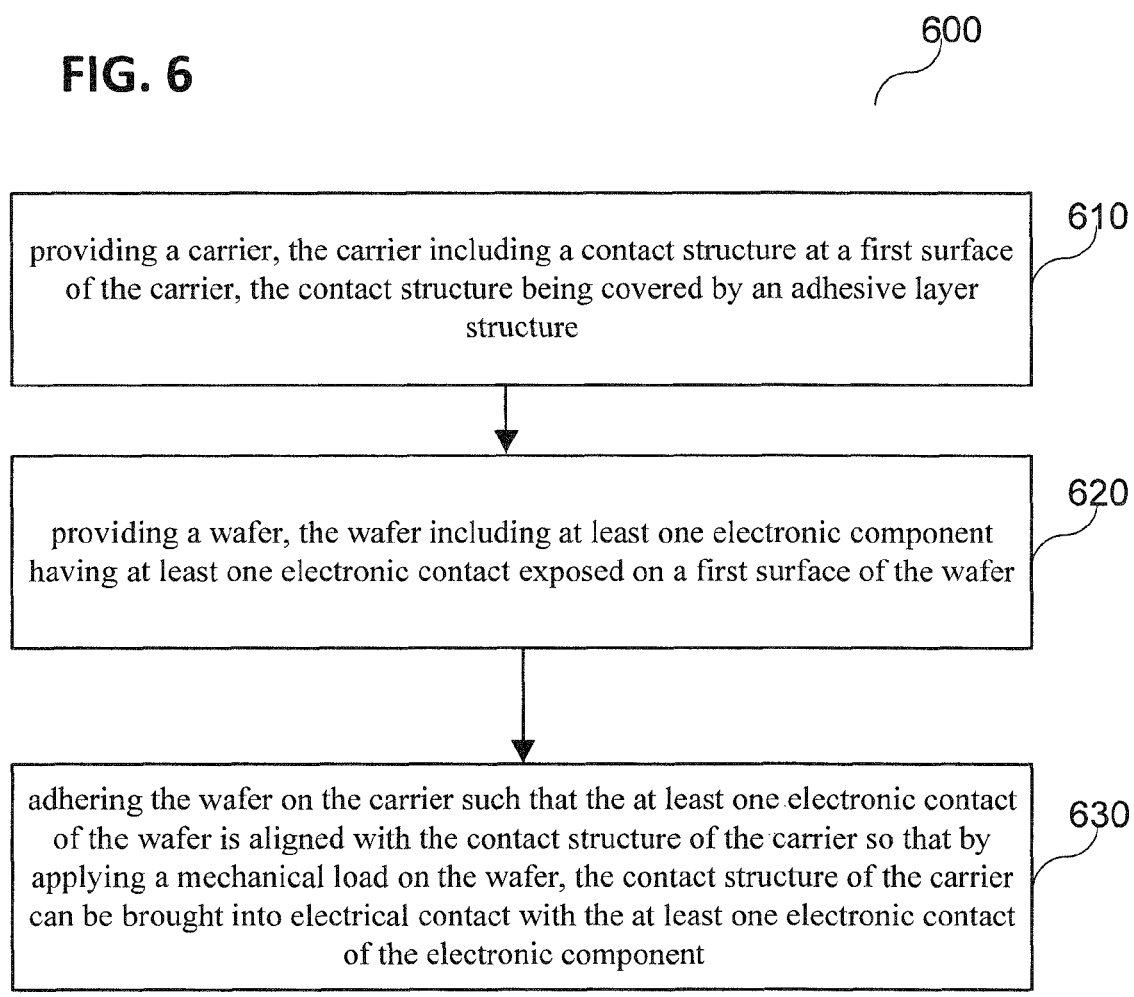

610 — providing a carrier, the carrier including a contact structure at a first surface of the carrier, the contact structure being covered by an adhesive layer structure 620 — providing a wafer, the wafer including at least one electronic component having at least one electronic contact exposed on a first surface of the wafer 630 — adhering the wafer on the carrier such that the at least one electronic contact of the wafer is aligned with the contact structure of the carrier so that by applying a mechanical load on the wafer, the contact structure of the carrier can be brought into electrical contact with the at least one electronic contact of the electronic component

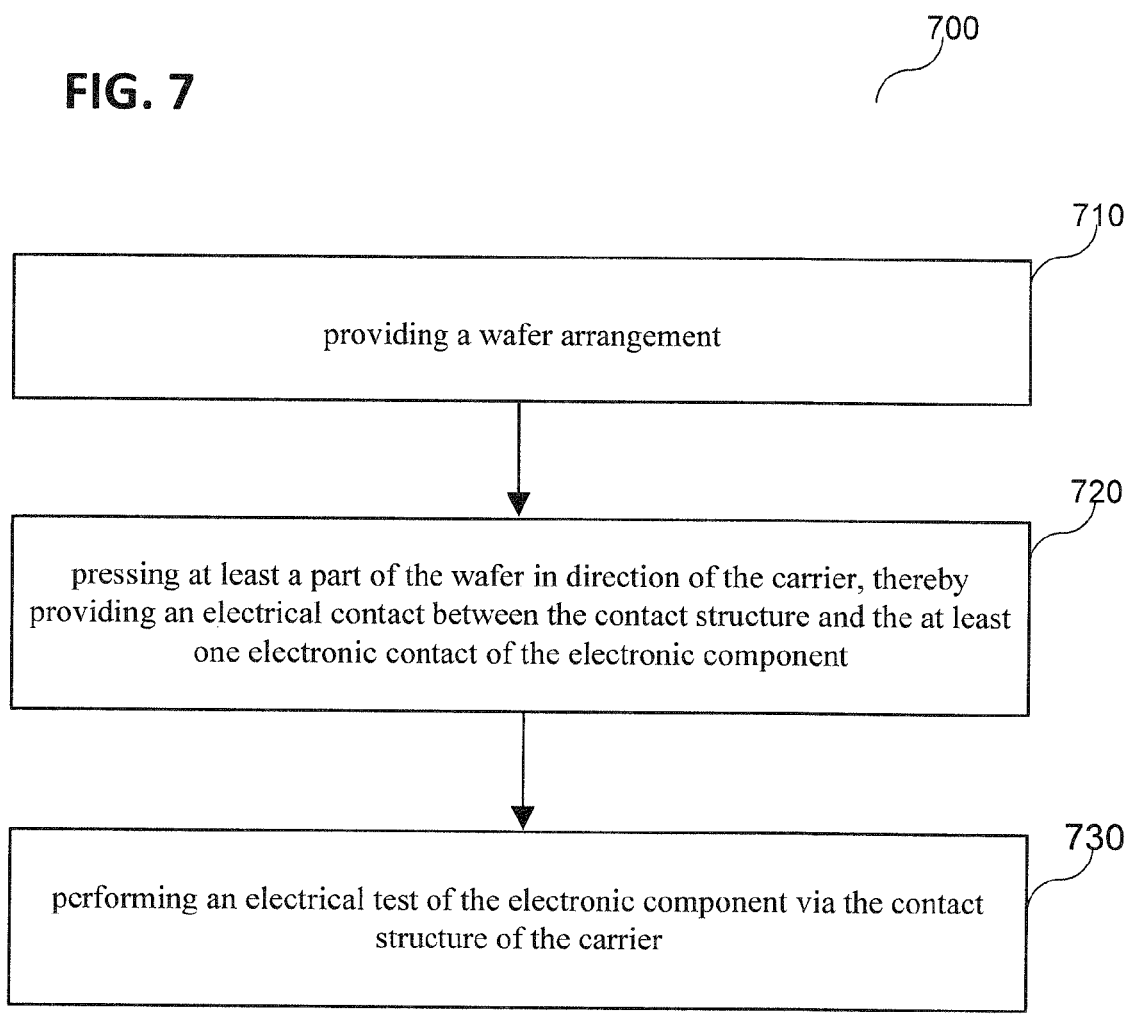

WAFER ARRANGEMENT, A METHOD FOR TESTING A WAFER, AND A METHOD FOR PROCESSING A WAFER

TECHNICAL FIELD

Various embodiments relate generally to a wafer arrangement, to a method for testing a wafer, and to a method for processing a wafer.

BACKGROUND

Generally, in semiconductor industry one or more electronic components, e.g. transistors, diodes, integrated circuits, power electronics, and the like, may be processed on a single wafer. In case that the wafer may be a thin wafer for the manufacture of the electronic components, e.g. having a thickness smaller than about 150 µm, or in case that the wafer should be thinned during processing, e.g. to a thickness smaller than about 150 µm, the wafer may be for example fixed on a glass carrier. In this case, at least one surface of the wafer, e.g. the front side or the backside, may be in physical contact with the glass carrier or may be covered by the glass carrier. Another possibility for processing a thin wafer or an ultra-thin wafer may include thinning the wafer partially, e.g. by forming a frame on the outer circumference of the wafer. Moreover, the electronic components may be tested after manufacture, e.g. to ensure their functioning or to develop new processes or methods for manufacturing, e.g. to get access to failures during processing. Therefore, the wafer may be for example diced and the separated electronic components may be tested subsequently, or, in case that the contacts of the electronic components to be tested are exposed, the electronic components may be tested on the wafer, e.g. using electrical testing equipment.

SUMMARY

According to various embodiments, a wafer arrangement may be provided. The wafer arrangement may include: a wafer including at least one electronic component having at least one electronic contact exposed on a surface of the wafer; an adhesive layer structure disposed over the surface of the wafer, the adhesive layer structure covering the at least one electronic contact; and a carrier adhered to the wafer via the adhesive layer structure, wherein the carrier may include a contact structure at a surface of the carrier aligned with the at least one electronic contact so that by pressing the wafer in direction of the carrier, the contact structure can be brought into electrical contact with the at least one electronic contact of the at least one electronic component.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a schematic flow diagram of a method for processing a wafer or of a method for manufacturing a wafer arrangement, according to various embodiments; and FIG. 7 shows a schematic flow diagram of a method for testing a wafer, according to various embodiments.

DESCRIPTION

Figure 1A:
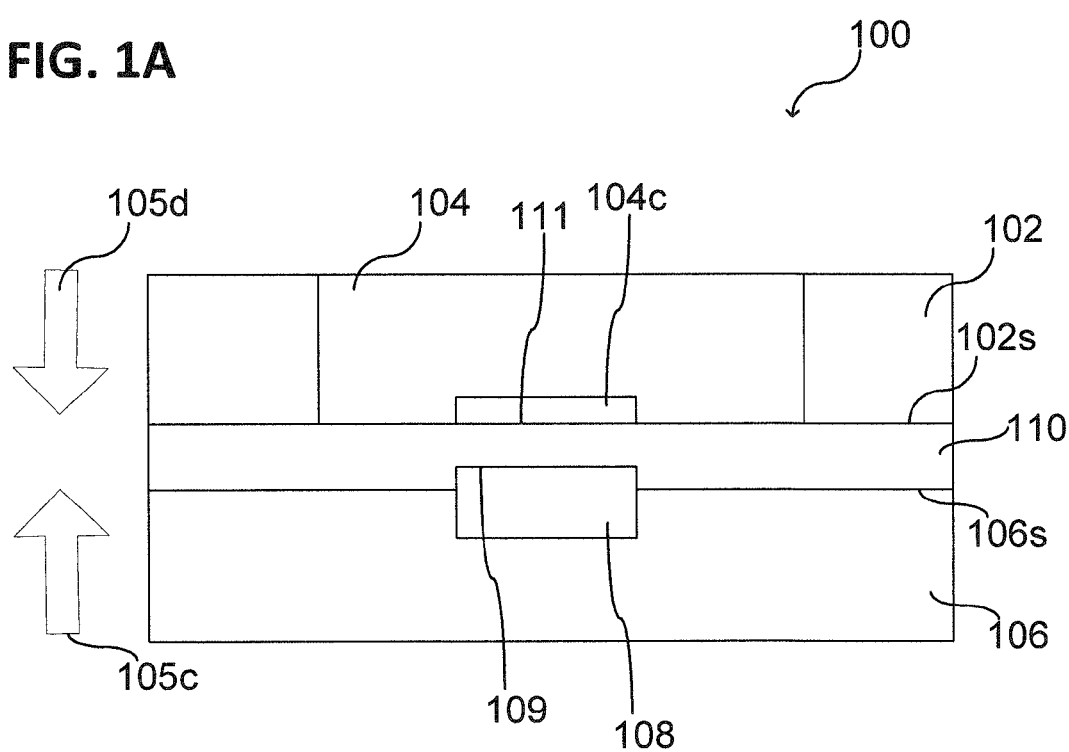
FIG. 1A shows a schematic cross sectional view or side view of a wafer arrangement in a first state, e.g. after the manufacture, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" surrounding, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

In general, processing a thin wafer or an ultra-thin wafer may be difficult, since the wafer may not have the necessary mechanical stability for the processing. Therefore, in commonly used processes, the wafer may be fixed to a bulk glass carrier. Despite this may provide an easy and cost efficient method for handling a thin wafer or a thinned wafer, e.g. for a wafer having a thickness in range from about several micrometers to about several tens of micrometers, e.g. in the range from about 5 µm to about 150 µm, this commonly used method may for example cause problems since one surface of the wafer, the surface being in contact with the carrier, may not be accessible during manufacturing, e.g. during the wafer and the electronic components may be fixed to the glass carrier. Electronic vertical components (e.g. power electronic components, as for example insulated gate bipolar transistors (IGBT) or power transistors) may have for example at least one first contact pad on a first surface of the wafer and at least one second contact pad on a second surface of the wafer, e.g. opposite to the first surface of the wafer, wherein the wafer may include a plurality of electronic vertical components arranged laterally next to each other. Illustratively, at least two contacts of an electronic component may be disposed on opposite surfaces of the wafer, wherein in this case mounting the wafer on a commonly used bulk glass carrier may not allow the electrical testing of electronic vertical components during processing, since at least one side of the wafer may be glued to the bulk glass carrier and therefore, some of the electrical contacts being necessary for testing may not be accessible. In other words, commonly used carriers for processing a thin wafer may not allow the testing of the processed electronic components during the processing (e.g. while the wafer is mounted on the carrier). This may be for example inefficient for a further processing of the electronic components, e.g. if the further processing may require definitively working electronic components.

According to various embodiments, a wafer arrangement, a method for processing a wafer, and a method for testing a wafer may be provided, wherein the wafer may be mounted on a carrier and wherein, at the same time, the wafer or one or more electronic components on the wafer can be electrically tested, e.g. via a testing equipment being electrically connected to the (e.g. exposed) electrical contacts of the wafer or to the electrical contacts of the one or more electronic components on the wafer. Illustratively, the carrier for mounting the wafer may include an electrical wiring structure that may allow electrically connecting the electrical contacts of the wafer or the electrical contacts of the one or more electronic components on the wafer to the testing equipment, and, at the same time, the wafer may be mounted on the carrier which may allow the processing of the wafer as desired, e.g. such that the wafer may not be damaged by the carrier, e.g. such that the carrier may not scratch the surface of the wafer during processing.

According to various embodiments, the carrier for processing and testing the wafer may include an integrated wiring structure, which may firstly allow the testing of the electronic components of the wafer, and secondly, which may allow the testing of a plurality of electronic components in parallel due to the extensive electrically contacting of the wafer via the wiring of the carrier. Illustratively, the carrier, as described herein, may allow a highly-parallel testing of electronic vertical components of a wafer, e.g. of insulated-gate bipolar transistors (IGBTs) or e.g. in general power transistors, during the manufacture, e.g. without removing the electronic vertical components from the carrier. According to various embodiments, the carrier may provide the mechanical stability for the wafer during processing, which may allow the processing of thin wafers and/or ultra-thin wafers.

According to various embodiments, the wafer may be mounted on the carrier such that the metal contacts of the carrier for electrically contacting the wafer for testing may only be in a direct (i.e. physical) contact to the wafer if desired, e.g. during a testing process. This may allow for example grinding the wafer without damaging the wafer by the metal contacts of the carrier. During processing, the wafer (e.g. not being thinned at this processing stage) may be mounted on the carrier, subsequently, the wafer may be thinned, processed, tested and transferred to a foil after being readily processed and tested, wherein the carrier may be used again (e.g. after cleaning of the carrier) for mounting the next wafer on the carrier.

According to various embodiments, the method for processing a wafer and the wafer arrangement described herein, may allow the processing of the wafer without losing the wafer edge. Illustratively, the complete wafer surface may be processed at the same time. Further, the testing of the electronic components on the wafer during manufacture may allow a cost efficient processing of electronic devices or chip arrangements, since defect electronic components may be sorted out already during the processing or during an early stage of the manufacture of an electronic device including one or more of these electronic components of the wafer.

Figure 1B:
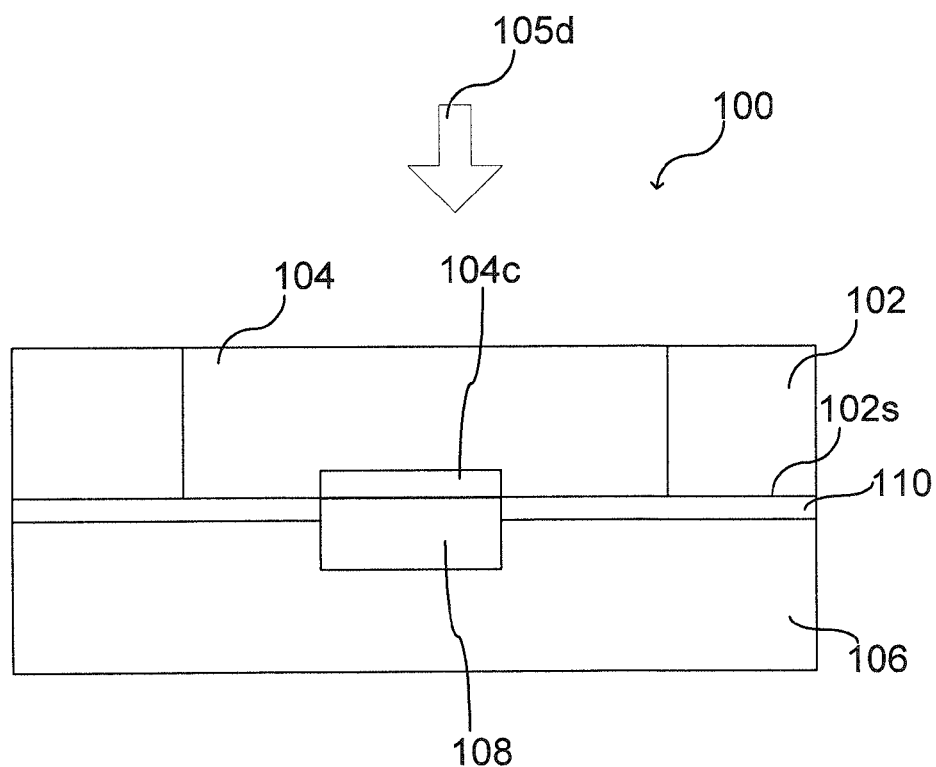
FIG. 1B shows a schematic cross sectional view or side view of a wafer arrangement in a second state, e.g. during testing of the wafer, according to various embodiments.

FIG. 1A and FIG. 1B illustrate a wafer arrangement 100 in a schematic cross sectional view and in a schematic side view, respectively, according to various embodiments, wherein the wafer arrangement 100 may include: a wafer 102 including at least one electronic component 104, wherein the at least one electronic component 104 may include at least one electronic contact 104c exposed on a surface 102s of the wafer 102. The wafer arrangement 100 may further include an adhesive layer structure 110 being disposed or being formed over the surface 102s of the wafer 102, the adhesive layer structure 110 may cover the at least one electronic contact 104c (e.g. partially or completely). The wafer arrangement 100 may further include a carrier 106 adhered to the wafer 102 via the adhesive layer structure 110, wherein the carrier 106 may include a contact structure 108 at a surface 106s of the carrier 106, the contact structure 108 being aligned with the at least one electronic contact 104c of the electronic component 104 so that by pressing (105d) the wafer 102 in direction of the carrier 106 or by pressing 105c the carrier 106 in direction of the wafer 102 or by pressing 105c, 105d the carrier 106 and the wafer against each other, the contact structure 108 can be brought into electrical contact with the at least one electronic contact 104c of the electronic component 104.

According to various embodiments, the wafer 102 may be or may include any type of semiconductor wafer, e.g. the wafer may be made of semiconductor materials of various types, including silicon, germanium, Group III to V or other types, including polymers, a metal, for example, although in another embodiment, other suitable materials can also be used. In an embodiment, the wafer substrate is made of silicon (doped or undoped), in an alternative embodiment, the wafer substrate is a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs).

According to various embodiments, the wafer 102 may be a silicon wafer 102 including at least one (e.g. one or more) electronic component 104. The electronic component 104 may be or may include at least one of the following: a transistor, a power transistor, an electrically vertical transistor, a bipolar transistor, an electrically vertical bipolar transistor, a field effect transistor, an insulated gate bipolar transistor (IGBT), an electrically vertical insulated gate bipolar transistor (IGBT), a thyristor, an electrically vertical thyristor, or any other electrically vertical device, e.g. an electronic component 104 including at least one front side contact and at least one backside contact. According to various embodiments, an electrical vertical device, as described herein, may be configured to provide a vertical current flow through the electronic component 104, e.g. from a first surface of the electronic component 104 to a second surface of the electronic component 104, e.g. from a first electrical contact on a first surface of the electronic component 104 to a second electrical contact on the second surface of the electronic component 104, or e.g. from a first surface of the wafer 102 to a second surface of the wafer 102, e.g. from a first electrical contact on a first surface of the wafer 102 to a second electrical contact on the second surface of the wafer 102, wherein the first surface may be opposite to the second surface. According to various embodiments, the electronic component 104 may be an electronic component 104 to be processed as for example illustrated in FIG. 1A and FIG. 1B, wherein the electronic contact 104c of the electronic component 104 may be at the surface 102s of the wafer 102 facing the carrier 106.

According to various embodiments, the electronic contact 104c may be a part of the electronic component 104, e.g. an electrode or a contact region, or the electronic contact 104c may be a region of the electronic component 104 being able to transport an electrical current, e.g. a doped region. Further, the electronic contact 104c may include an electrically conductive material, e.g. a metal or a metal alloy. According to various embodiments, the electronic contact 104c may be a part of a metallization of the wafer 102 or of the electronic component 104 on the wafer 102. In other words, at least a part of the metallization or wiring of the electronic component 104 or of the wafer 102 may be exposed on the surface 102s of the wafer facing the carrier 106, wherein the part of the metallization or wiring may provide the electronic contact 104c being exposed on the surface 102s of the wafer 102 facing the carrier 106.

According to various embodiments, an exposed surface 111 of the electronic contact 104c may be substantially coextensive with the surface 102s of the wafer 102, as for example illustrated in the figures. Alternatively, the electronic contact 104c may protrude from the surface 102s of the wafer 102 or the electronic contact 104c may be recessed into the wafer 102.

According to various embodiments, the carrier 106 may be configured as a wafer carrier for mechanically supporting the wafer 102 if the wafer 102 is mounted on the carrier 106 via the adhesive layer structure 110. According to various embodiments, the carrier 106 may include for example glass or may be a glass substrate 106 or a glass carrier 106. The carrier 106 may include a wiring structure or a metallization structure, wherein the wiring structure or the metallization structure may be electrically conductively connected to the contact structure 108 or wherein the wiring structure or a metallization structure may provide the contact structure 108. According to various embodiments, the contact structure 108 may protrude from the surface 106s of the carrier 106 facing the wafer 102, e.g. such that the contact structure 108 may provide a direct (physical) contact to the electronic contact 104c if the carrier 106 and the wafer 102 may be pressed together, as illustrated in FIG. 1B. According to various embodiments, the contact structure 108 may include an electrically conductive material, e.g. a metal, e.g. tungsten or steel, or a doped semiconductor, e.g. doped silicon. The carrier 106 may include any suitable type of carrier, e.g. a semiconductor carrier, as described before. According to various embodiments, the carrier 106 may include a ceramic material or may be a ceramic carrier, e.g. the carrier may include a sintered ceramic or may be a sintered carrier 106. According to various embodiments, since the carrier 106 may include a wiring or an electrical routing, the carrier 106 may include an electrically insulating material, e.g. glass, an oxide, a nitride, or an electrically insulating ceramic material.

Alternatively, in the case, that the wiring and the contact structure 108 of the carrier may be electrically isolated from the carrier 106, e.g. via an additional electrically isolating material or via a dielectric material being formed or disposed between the contact structure 108 and the carrier 106 and/or between the wiring and the carrier 106, the carrier 106 may include an electrically conductive material, e.g. a metal, e.g. steel, aluminum, copper, and the like. According to various embodiments, the carrier may be a silicon carrier including a wiring (e.g. a metallization), wherein the contact structure 108 may be a part of the wiring or the metallization of the carrier 106 or may be provided by the wiring or the metallization of the carrier 106.

According to various embodiments, the wafer 102 or the electronic component 104 on the wafer 102 may include a wafer metallization structure or a wafer wiring structure, as already described, wherein the wafer metallization structure or the wafer wiring structure may provide or may include for example the at least one electronic contact 104c or one or more electronic contacts of the electronic component 104. According to various embodiments, the wafer 102 and/or the electronic component 104 may include a so-called single-level wafer metallization including a single wiring layer or a multi-level metallization including a plurality of wiring layers being arranged in a layer stack, wherein the wafer metallization structure may for example provide the electrical connection between electronic circuit structures of the electronic component 104 for enabling the functioning of the electronic component 104 and/or wherein the wafer metallization structure may for example provide an access to the electronic component 104, e.g. via the electronic contact 104c to electrically connect the electronic component 104 to a peripheral device to a testing device, or to integrate the electronic component 104 into a device during further processing.

According to various embodiments, the carrier 106 may include a carrier metallization structure or a carrier wiring structure, as already described, the carrier metallization structure or the carrier wiring structure may provide or may include for example at least one contact structure 108. Further, the carrier metallization structure or the carrier wiring structure may serve as a redistribution layer providing a plurality of contacts and/or contact pads being connected for example via a wiring structure. Further, the carrier metallization structure or the carrier wiring structure may provide one or more through contacts 108 (see for example FIG. 2A and FIG. 2B), such that the electronic contact 104c may be accessible from the surface of the carrier 106 facing away from the wafer 102.

According to various embodiments, the wafer metallization may include a patterned dielectric layer or a dielectric layer structure including an electrically insulating material (e.g. a dielectric material), wherein the dielectric layer or the dielectric layer structure may include at least one of recesses, voids, holes, through holes, and the like, being filled with an electrically conductive material providing the electrical wiring of the wafer metallization; the electrical wiring may for example include one or more metal lines, one or more vias, and one or more contact structures.

According to various embodiments, the carrier metallization may include a patterned carrier 106 (e.g. including a dielectric material, e.g. glass or ceramic) or a dielectric layer structure within the carrier 106 including an electrically insulating material (e.g. a dielectric material), wherein the carrier and/or the dielectric layer structure may be configured to provide at least one of recesses, voids, holes, through holes, and the like, being filled with an electrically conductive material providing the electrical wiring of the carrier metallization; the electrical wiring may for example include one or more metal lines, one or more vias, and one or more contact structures.

The term "dielectric" as used herein referring to a dielectric material, a dielectric layer, a dielectric structure, and the like, may be used herein to mean an electrically insulating material in general. Further the term "dielectric" may refer to a so-called low-κ material, as typically used in metallization structures in any semiconductor technology. According to various embodiments, at least one of the following materials may be used to provide a dielectric layer or a dielectric structure: silicon oxide (dielectric constant of 3.9) and a material having a smaller a dielectric constant then silicon oxide, e.g. fluorine-doped silicon dioxide, fluorosilicate glass, carbon-doped silicon dioxide, porous silicon dioxide, porous carbon-doped silicon dioxide, organic dielectrics, dielectric polymers, silicone based polymeric dielectrics, polynorbornenes, benzocyclobutene, polytetrafluoroethylene, resins, hydrogen silsesquioxane (HSQ), methylsilsesquioxane (MSQ) and the like.

According to various embodiments, a wiring, a metallization, the electronic contact 104c and/or the contact structure 108 may include for example at least one of the following: a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)). Further, a wiring, a metallization, the electronic contact 104c and/or the contact structure 108 may include for example one or more additional layers, as for example a barrier layer (e.g. including at least one of molybdenum, a transition metal nitride (e.g. titanium nitride), platinum silicide, titanium silicide, tungsten silicide, molybdenum silicide, borides, tantalum, tungsten, and the like), or an adhesion promoter layer (e.g. including at least one of platinum silicide, titanium silicide, tungsten silicide, molybdenum silicide, and the like).

According to various embodiments, the wafer 102 may be flexible, e.g. due to the small thickness of the wafer 102 (e.g. smaller than about 150 μm) and the material of the wafer 102, e.g. silicon. Therefore, the wafer 102 may be deformed without being damaged, e.g. such that the wafer 102 can be pressed into the direction of the carrier 106. In this case, the wafer 102 may bend and the at least one electronic contact 104c of the electronic component 104 on the wafer 102 may electrically contact the contact structure 108 of the carrier 106. Illustratively, the wafer 102 may be deformed (bent) by applying a mechanical load 105d on the wafer 102, wherein the carrier 106 may be fixed, such that only a part of the wafer may contact the contact structure 108 of the carrier 106.

According to various embodiments, pressing the wafer 102 in direction of the carrier 106 may cause the displacement of the adhesive layer structure 110, and therefore, the contact structure 108 can be brought into electrical contact with the at least one electronic contact 104c of the electronic component 104. Illustratively, the adhesive layer structure 110 may be displaced such that there may be no material of the adhesive layer structure 110 between the electronic contact 104c and the contact structure 108 after the wafer 102 and the carrier 106 has been pressed together, and therefore, the electronic contact 104c may be in direct mechanical contact with the contact structure 108 which may provide the electrically conducting connection between the electronic component 104 of the wafer 102 and the contact structure 108 of the carrier 106. According to various embodiments, the displacement of the adhesive layer structure 110 may be elastic or at least partially elastic such that the adhesive layer structure 110 may fill the gap between the electronic contact 104c and the contact structure 108 again after the pressure 105d on the wafer 102 may be released, and therefore, e.g. after testing, the wafer 102 and the carrier 106 may be separated via the adhesive layer structure 110 again. Illustratively, FIG. 1A shows the wafer arrangement 100 before and after testing and FIG. 1B shows the wafer arrangement 100 during testing.

According to various embodiments, the wafer arrangement 100 may be flexible such that in case that there may be no external mechanical load (force or pressure) applied on the wafer arrangement 100, the contact structure 108 of the carrier 106 may not contact the wafer 102 or the electronic component 104 of the wafer 102. Therefore, the wafer may be protected from being damaged by the carrier 106 and the contact structure 108 of the carrier by the adhesive layer structure 110, e.g. which may be flexible or elastic, during processing of the wafer 102.

The processing of the wafer 102 being mounted on the carrier 106 may include at least one of the following: one or more layering processes (e.g. one or more chemical vapor deposition processes, e.g. one or more physical vapor deposition processes), one or more patterning processes (e.g. including lithographic processes, etch processes, polishing processes), one or more doping processes (e.g. ion-implantation), and transferring the wafer 102 from the carrier 106 to a dicing carrier (e.g. a dicing foil).

According to various embodiments, before the wafer 102 may be mounted on the carrier 106, the surface 102s of the wafer 102 facing the carrier 106 may be readily processed, e.g. one or more electronic components 104 may be at least partially formed on the wafer 102. Further, the processing of the opposite surface of the wafer 102 facing away from the carrier 106 may be performed for example during the wafer 102 is mounted on the carrier 106, e.g. the opposite surface facing away from the carrier 106 may be thinned, e.g. via polishing and/or etching, after the wafer 102 may be mounted on the carrier 106. Subsequently, the thinned wafer may be processed, e.g. regions of the wafer may be doped, e.g. via ion implantation and/or one or more thermal treatments or an additional electronic contact may be formed over the surface of the wafer 102 facing away from the carrier 106.

Illustratively, the pre-processed wafer 102 may be mounted on the carrier 106 and the processing of the wafer 102 may be completed. Subsequently, the wafer 102 may be tested, as already described. After being tested, the wafer 102 or the electronic components 104 of the wafer 102 may be further processed while being mounted on the carrier 106 or the wafer 102 or the electronic component 104 of the wafer 102 may be released from the carrier 106.

According to various embodiments, the adhesive layer structure 110 may include a glue or an adhesive, e.g. 3M™ Liquid UV-Curable Adhesive LC-3200. Referring to this, the adhesive layer structure 110 may include an acrylate based glue, or any other glue being able to provide a removable connection of the wafer 102 and the carrier 106, e.g. a light-to-heat-conversion release coating.

According to various embodiments, the wafer 102 may be glued on the carrier 106 for mounting the wafer 102 on the carrier 106, and the glue may be removed or deactivated, e.g. via a solvent, via UV-light, and/or via a mechanical removing process, to release the wafer 102 from the carrier 106, e.g. after the processing is finished and/or after the testing is finished. After being cleaned, the carrier 106 may be used again for mounting a wafer 102.

Various modifications and/or configurations of the wafer arrangement 100 and details referring to the electronic component 104, the adhesive layer structure 110, the carrier 106, and the contact structure 108 are described in the following, wherein the features and/or functionalities described referring to FIGS. 1A and 1B may be included analogously. Further, the features and/or functionalities described in the following may be included in the wafer arrangement 100 or may be combined with the wafer arrangement 100, as described before referring to FIGS. 1A and 1B.

Figure 2A:
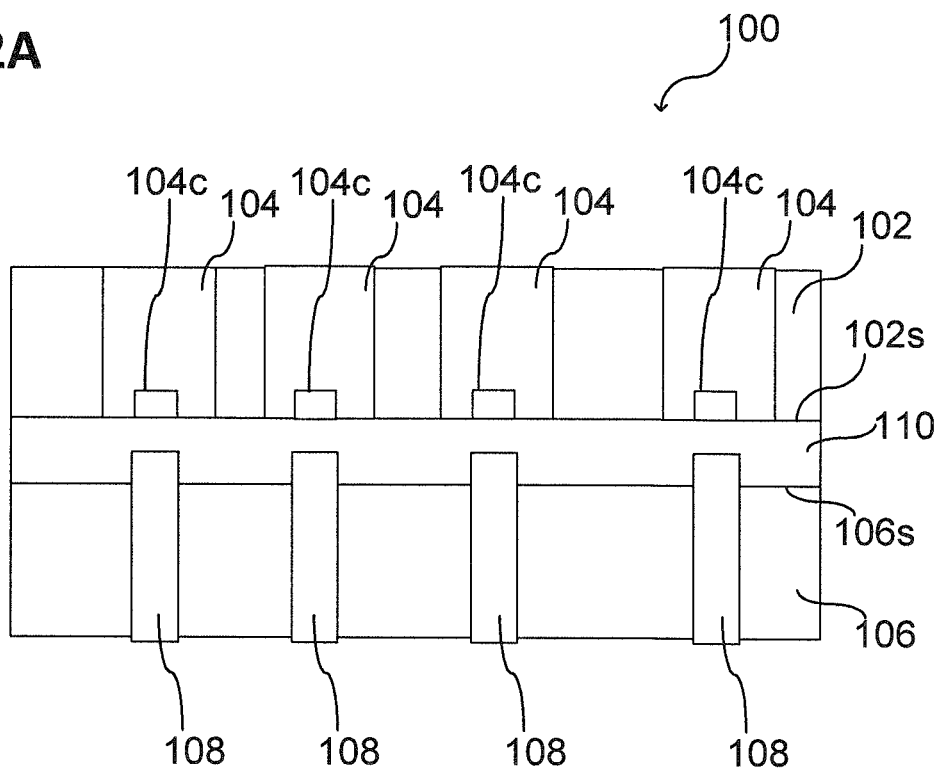
FIG. 2A shows a schematic cross sectional view or side view of a wafer arrangement in a first state, e.g. after the manufacture, according to various embodiments.

As illustrated in FIG. 2A, the wafer 102 may include a plurality of electronic components 104, wherein each electronic component 104 of the plurality of electronic components 104 may include at least one electronic contact 104c. Further, the carrier 106 may include a plurality of contact structures 108 or the contact structure 108 of the carrier 106 may include a plurality of contacts 108. According to various embodiments, the carrier 106 may be designed such that the plurality of contact structures 108 may match the electronic contacts 104c of the plurality of electronic components 104 of the wafer 102. FIG. 2A illustrates the wafer arrangement 100 in a non-compressed state, e.g. during processing of the mounted wafer 102.

Figure 2B:
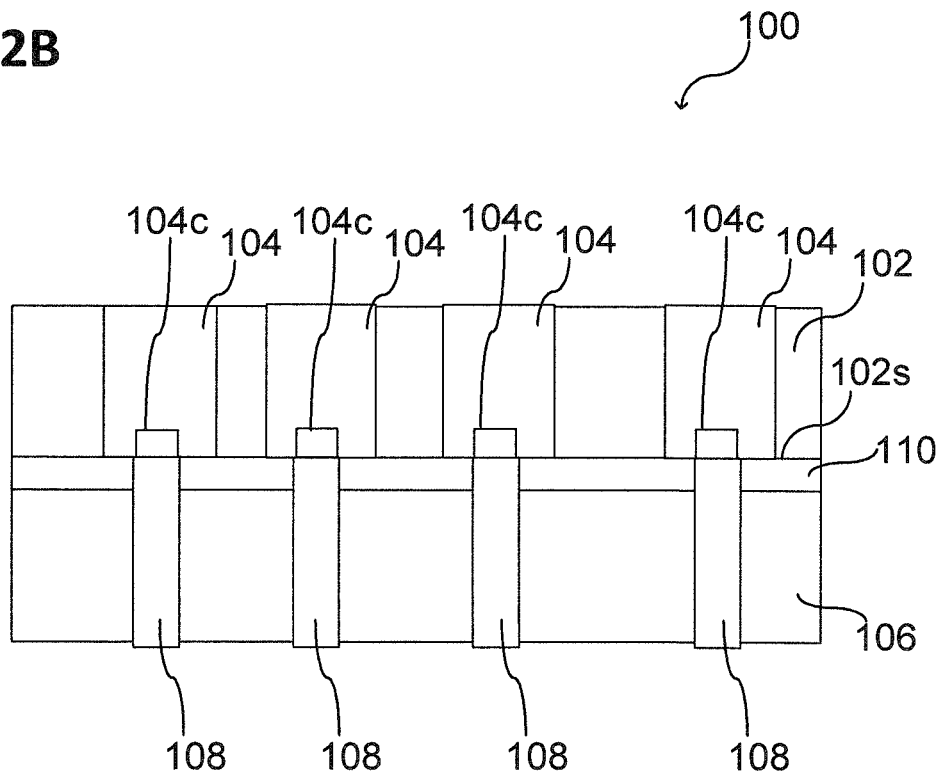
FIG. 2B shows a schematic cross sectional view or side view of a wafer arrangement in a second state, e.g. during testing of the wafer, according to various embodiments.

Further, as illustrated in FIG. 2B, the wafer 102 and the carrier 106 may be pressed together such that the electronic contacts 104c of the plurality of electronic components 104 may be in contact (or may be brought in contact) with the plurality of contact structures 108 of the carrier 106, or such that at least part of the electronic contacts 104c of the plurality of electronic components 104 may be in contact with at least part of the plurality of contact structures 108 of the carrier 106. According to various embodiments, the carrier 106 may include a single contact structure 108 for each electronic contact 104c to be connected to the carrier 106. The contact structure 108 may further include a redistribution wiring.

According to various embodiments, the contact structures 108 may extend through the carrier 106, e.g. from the surface 106s of the carrier 106 facing the wafer 102 to the opposite surface of the carrier facing away from the wafer 102. In other words, the carrier 106 may include one or more holes (through holes) being filled with an electrically conductive material providing the one or more contact structures 108. The one or more contact structures 108 may include a metal with a sufficient high hardness, e.g. tungsten, titanium, tantalum and/or steel, such that the one or more contact structures 108 protruding from the surface 106s of the carrier 106 may not be damaged or broken due to the direct contact to the wafer 102 or to the electronic components 104 while the wafer 102 is pressed against the carrier 106.

The carrier 106 may be a glass carrier, wherein a plurality of holes may be formed through the carrier 106, e.g. via mechanical drilling, laser drilling, etching, and the like, and wherein the plurality of holes being formed through the carrier 106 may be filled with a metal, e.g. tungsten or with more than one metal. Alternatively, the carrier may be pre-formed via a ceramic material (e.g. a ceramic powder to be sintered), the one or more contact structures 108 may be arranged within the ceramic material (e.g. one or more metal pins may be positioned in the ceramic material), and subsequently, the ceramic material may be sintered providing a ceramic carrier 106 including the one or more contact structures 108. Alternatively, a formwork may be provided for injecting the ceramic material to provide the carrier 106, the one or more contact structures 108 may be arranged within the formwork (e.g. one or more metal pins may be positioned in the formwork), the ceramic material may be injected into the formwork, and subsequently, the ceramic material may be sintered providing a ceramic carrier 106 including the one or more contact structures 108. Alternatively, the carrier 106 may be a semiconductor carrier, wherein the contact structure 108 may be provided by patterning the semiconductor carrier 106 and filling the patterned semiconductor carrier via a metal, thereby providing the one or more contact structures 108. In other words, the carrier 106 including the contact structure 108 may be formed via semiconductor processing (layering, patterning, and the like) of the carrier 106. Further, the one or more contact structures 108 may be provided or may be partially provided by doping the carrier 106, e.g. by implanting ions into the semiconductor carrier 106. Further, according to various embodiments, the carrier may include an embedded wafer level ball grid array or a design similar to an embedded wafer level ball grid array.

Figure 3A:
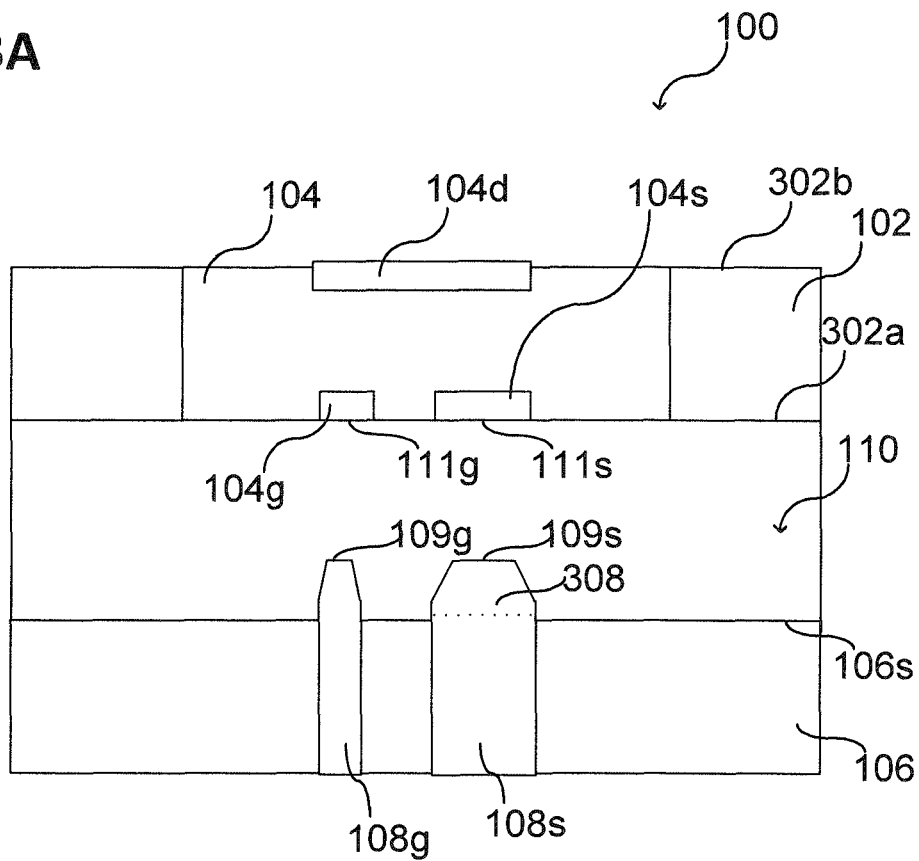
FIG. 3A shows a schematic cross sectional view or side view of a wafer arrangement in a first state, e.g. after the manufacture, according to various embodiments.

As illustrated in FIG. 3A, the wafer 102 may include at least one transistor 104, e.g. a vertical IGBT or a vertical power transistor, wherein the at least one transistor 104 may include a source contact 104s on a first surface 302a of the wafer 102 and a drain contact 104d on a second surface 302b of the wafer 102, wherein a current flow from the source contact 104s on the first surface 302a of the wafer 102 and the drain contact 104d on the second surface 302b of the wafer 102 may be controlled via a gate structure being addressed via a gate contact 104g on the first surface 302a of the wafer 102. Illustratively, the electronic component 104 may be an electronic vertical component, wherein the functioning of the electronic vertical component may base on a current flow from a first contact 104s on the first surface 302a to a second contact 104d on the second surface 302b of the wafer. According to various embodiments, the wafer 102 may have in thickness (or height) in the range from about 50 µm to about 150 µm.

Further, the carrier 106 may include a plurality of contact structures 108 for electrically contacting the electronic contact 104s, 104g of the electronic component 104, e.g. one contact structure 108g of the carrier 106 may be configured to electrically contact the gate contact 104g of the electronic component 104 and another contact structure 108s of the carrier 106 may be configured to electrically contact the source contact 104s of the electronic component 104. According to various embodiments, the contact structure 108s contacting the source contact 104s of the electronic component 104 may be designed to carry or transport a higher electrical current than the contact structure 108g contacting the gate contact 104g of the electronic component 104. According to various embodiments, the carrier 106 may be designed such that the contact structures 108g, 108s may match the electronic contacts 104g, 104s of the electronic component 104 (the transistor 104) of the wafer 102. FIG. 2A illustrates the wafer arrangement 100 in a state without an externally applied pressure to electrically connect the electronic contacts to the contact structures, e.g. a state during processing of the mounted wafer.

Figure 3B:
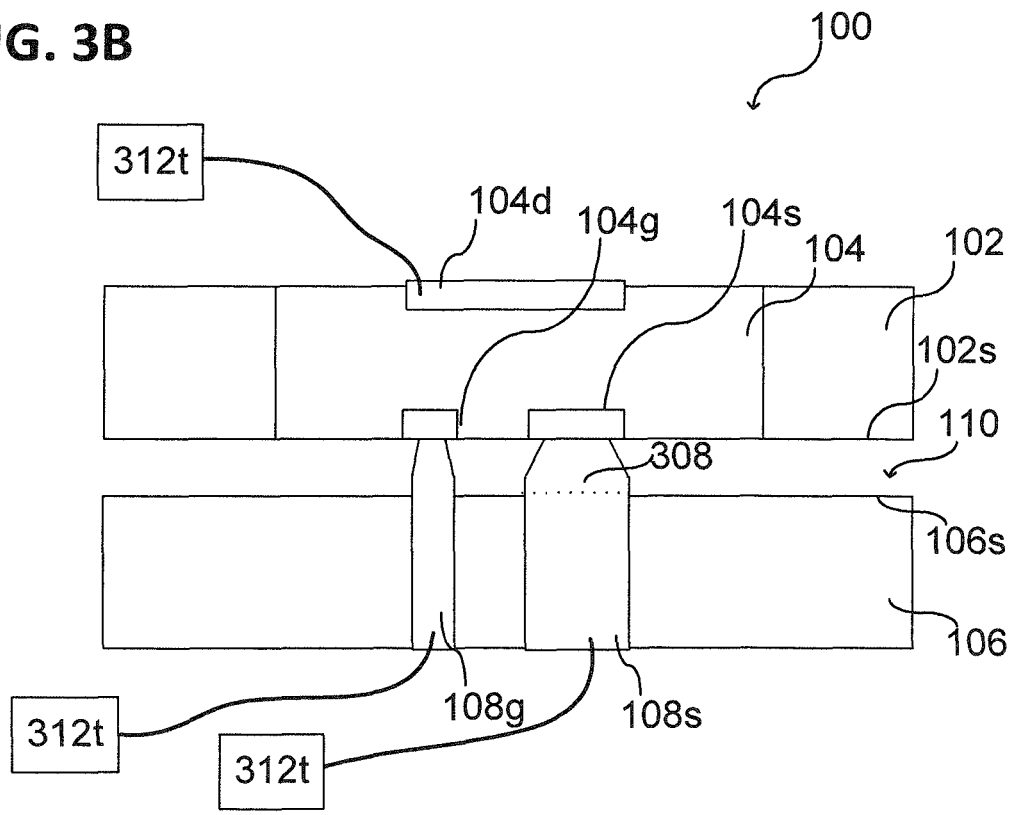
FIG. 3B shows a schematic cross sectional view or side view of a wafer arrangement in a second state, e.g. during testing of the wafer, according to various embodiments.

Further, as illustrated in FIG. 3B, the wafer 102 and the carrier 106 may be pressed together such that the electronic contacts 104g, 104s of the transistor 104 may be in contact with the contact structures 108g, 108s of the carrier 106. According to various embodiments, as illustrated in FIGS. 3A and 3B, the contact structure 108 may include at least a region 308 protruding from the surface 106s of the carrier 106, wherein the region 308 of the contact structure 108 may have a conical shape, e.g. the shape of a truncated cone or of a truncated pyramid (or in general a truncated prism). In this case, the contact structure 108 may displace the material of the adhesive layer structure 110 more easily while the wafer 102 may be pressed in the direction of the carrier 106, such that the electrical connection between the electronic contact 104c and the corresponding contact structure 108 may be established. If the material of the adhesive layer structure 110 is displaced in the region between the electronic contact 104c and the corresponding contact structure 108, the surfaces 109g, 109s of the contact structures 108g, 108s may be in direct contact to the surfaces 111g, 111s of the electronic contacts 104g, 104s.

As illustrated in FIG. 3B, according to various embodiments, the wafer arrangement 100 may be electrically conductively connected to a testing device 312. In other words, the electronic component 104 of the wafer 102 may be electrically conductively connected to an external testing device 312. Thereby, the drain contact 104d may be for example directly connected to the testing device 312, e.g. via a wiring (e.g. bond wire) or via a probe card or a needle pad. The testing device 312 may be a wafer prober or may include a suitable test equipment for testing and/or diagnosing the at least one electronic component 104 of the wafer 102. Further, the source contact 104s and the gate contact 104g of the electronic component 104 may be electrically conductively connected to the external testing device 312 as well, via the contact structures 108g, 108s of the carrier 106, since the electronic contacts 104g, 104s on the surface 102s of the wafer may not be directly accessible.

Therefore, the one or more contact structures 108 of the carrier may be electrically coupled to the testing device 312, e.g. via a wiring (e.g. bond wire) or via a probe card or a needle pad. According to various embodiments, the testing device 312 may be configured to test automatically all electronic components 104 disposed on the wafer 102, or a selected number of electronic components 104 disposed on the wafer 102. Further, a test pattern may be applied to the wafer 102 or to the electronic components 104 of the wafer 102 checking the functionality of the wafer 102 or of the electronic components 104 of the wafer 102. Therefore, the electronic component 104 may be processed to be already working at this processing stage. Further, the wafer may be subjected to a further processing, e.g. packaging process, or the electronic components 104 may be integrated into an electronic device, after the testing of the wafer 102 or of the electronic components 104 of the wafer 102 has been finished. Therefore, the testing may increase the efficiency of the processing, since a defect wafer 102 or a defect electronic component 104 may be sorted out an earliest processing stage.

According to various embodiments, the electronic components 104 may be separated from each other via a dicing of the wafer 102. Therefore, the wafer 102 may be transferred from the carrier 106 to a dicing tape. Subsequently, the individual electronic components 104 may be for example encapsulated into housings (the electronic components 104 may be packaged) or the electronic components 104 may be integrated into electronic devices or other electronic components.

Figure 4:
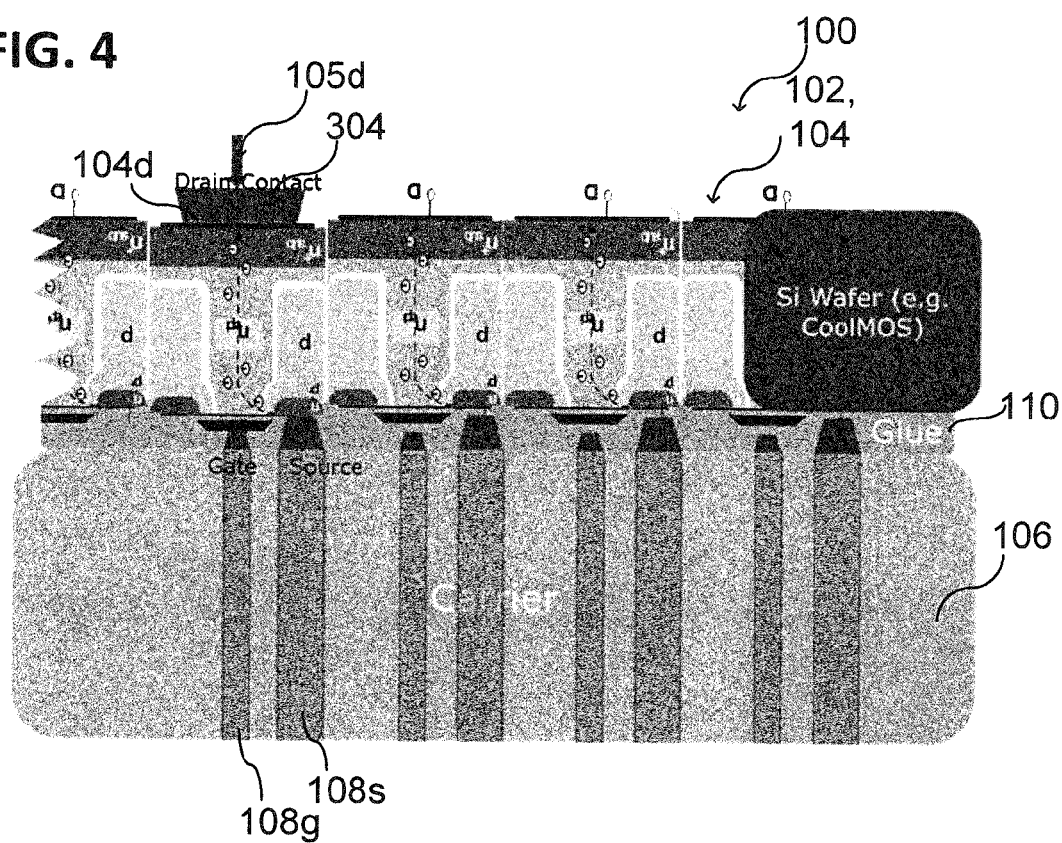
FIG. 4 shows a schematic cross sectional view or side view of a wafer arrangement, according to various embodiments.

In analogy to the wafer arrangement 100 illustrated in FIGS. 3A and 3B, a wafer arrangement 100 is shown in FIG. 4 including a plurality of electronic components 104, e.g. a plurality of electronic vertical transistors 104. The source contacts and the gate contacts of the electronic components 104 may be electrically conductively connected to the contact structure 108 of the carrier 106 in case the wafer 102 is pressed on the carrier or in case at least part of the wafer 102 is pressed on the carrier 106. According to various embodiments, a stamp 304 may be used to press the wafer 102 into the direction of the carrier 106, wherein the carrier 106 may be mechanically fixed for providing the counterforce. The stamp 304 may further be configured to provide the electrical connection to the drain contact 104d at the same time. Alternatively, a connection structure may be used to provide the electrical connection to the drain contact 104d. Further, a connection structure may be used to electrically connect to the contact structures 108g, 108s of the carrier 108.

Further, according to various embodiments, the carrier 106 may include a wiring embedded into the carrier 106. The carrier 106 and the wafer 102 may have substantially the same lateral extension (diameter). The carrier 106 and/or the wafer 102 may have a diameter in the range from about several centimeters to about several tens of centimeters, e.g. a diameter in the range from about 10 cm to about 30 cm or even larger than 30 cm.

The carrier 106 may include glass (silicon oxide based or another glass) having a thickness in the range from about 0.1 mm to about 10 mm, e.g. in the range from about 0.3 mm to about 1 mm. According to various embodiments, the width (lateral extension) of the contact structure 108 may be in the range from about 50 µm to about 300 µm, e.g. in the range from about 80 µm to about 200 µm. According to various embodiments, the carrier may be electrically insulating or the carrier material may be at least encapsulated into an electrically insulating material.

According to various embodiments, the glue forming the adhesive layer structure 110 may be electrically insulating. Further, the glue forming the adhesive layer structure 110 may be at least partially displaceable, therefore, as shown in FIG. 4 schematically, only a part of the wafer may be in contact to the carrier since the wafer may bend under the pressure caused by the stamp 304. The glue of the adhesive layer structure 110 may prevent that the contact structure 108 may scratch the surface 102s of the wafer 102 facing the carrier 106, e.g. during transport, processing, and/or grinding of the wafer 102. For testing the wafer, the glue of the adhesive layer structure 110 may be pushed away by the contact structure 108 approaching the electronic contact 104c of the electronic component 104 and the contact structure 108 may be in direct contact to the electronic contact 104c such that a current may flow through the contact structure 108 into the electronic component 104.

Depending on the compressibility and/or viscosity of the glue, more than one electronic component 104 may be tested at the same time or all electronic components 104 of the wafer 102 may be tested at the same time.

According to various embodiments, the width of the contact structure 108 may be larger than the width of the corresponding electronic contact 104c such that it may be easier to position the wafer 102 over the carrier 106 to ensure an electrical contact during the testing. Further, more than one contact structure 108 may be provided for a corresponding single electronic contact 104c such that it may be easier to position the wafer 102 over the carrier 106 to ensure an electrical contact during the testing.

For mounting (bonding) the wafer 102 to the carrier 106, a glue may be disposed over the surface 106s of the carrier 106 and/or the surface 102s of the wafer 102, the surface 106s of the carrier 106 facing the surface 102s of the wafer 102. After the wafer 102 may be positioned on the carrier 106, the glue may be cured (e.g. annealed or cured via UV-light).

For demounting (removing, releasing, or debonding) the wafer 102 from the carrier 106, at least a part of the adhesive layer structure 110 may be solved via a suitable solvent. In this case, the carrier may be transparent or non-transparent to electromagnetic radiation (e.g. light, e.g. UV-light). Alternatively, the wafer 102 may be debonded from the carrier 106 via an UV-debonding process, wherein at least a part of the adhesive layer structure 110 may be subjected to ultraviolet (UV) light for heating at least a part of the adhesive layer structure 110. Subsequently, the wafer 102 may be mechanically removed from the carrier 106, e.g. the wafer 102 may be transferred to a foil, and remaining glue may be removed from the carrier, e.g. the carrier 106 may be chemically cleaned. In this case, the carrier may be transparent to the respective light being used for curing the glue and heating at least a part of the adhesive layer structure 110, e.g. the carrier may be transparent to UV-light. Therefore, the carrier 106 may include for example corundum ($Al_2O_3$). According to various embodiments, the carrier may also include a transparent polymer or compound.

Figure 5:
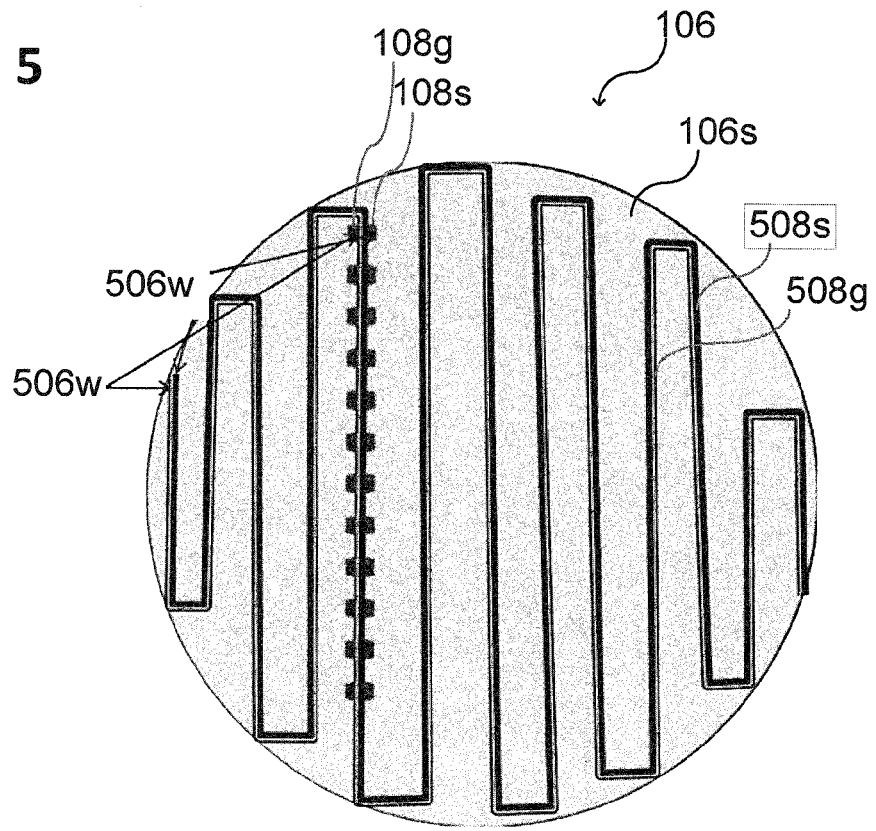
FIG. 5 shows a schematic top view of a carrier included in a wafer arrangement, according to various embodiments.

FIG. 5 shows a schematic top view of the carrier 106 included in the wafer arrangement 100, according to various embodiments. The carrier 106 may include a wiring (wiring structure) 506w, wherein the wiring may electrically conductively connect the one or more contact structures 108 of the carrier 106. Therefore, a plurality of electronic components 104 may be tested at the same time, e.g. in parallel. Further, the number of contacts connecting the carrier 106 to the testing device 312 may be reduced, e.g. there may be only two contacts necessary, a first one connecting all the gate contact structures 108g with the testing device 312 and a second one connecting all the source contact structures 108s with the testing device 312. Referring to this, the respective electronic component 104 to be tested may be selected by pressing the respective electronic component 104 on the carrier 106 such that the electronic contacts 104c, e.g. the source contact 104s and the gate contact 104g, of the electronic component 104 may be connected to the respective source contact structure 108s and gate contact structure 108g. A parallel testing of the electronic components 104 may be possible by pressing more than one electronic component 104 in the direction of the carrier 106.

As shown in FIG. 5, the plurality of gate contact structures 108g may be connected to each other via a meander shaped gate wiring structure 508g (a first wiring) and the plurality of source contact structures 108s may be connected to each other via a meander shaped source wiring structure 508s (a second wiring).

According to various embodiments, a carrier 106 for carrying a wafer 102 may include: an electrically conductive meander shaped first wiring 508g and an electrically conductive meander shaped second wiring 508s, the second wiring 508s being electrically isolated from the first wiring 508g, a first contact structure 108g being electrically connected to the first wiring 508g; and a second contact structure 508s being electrically connected to the second wiring 508s, wherein the first contact structure 108g and the second contact structure 108s may protrude from a first surface 106s of the carrier 106 to electrically connect to a wafer 102 being arranged in a distance over the first surface 106s of the carrier 106.

FIG. 6 shows a schematic flow diagram of a method 600 for processing a wafer or of a method 600 for manufacturing a wafer arrangement, according to various embodiments; the method 600 may include: in 610, providing a carrier 106, the carrier 106 including a contact structure 108 at a first surface 106s of the carrier 106, wherein the contact structure 108 may be covered by an adhesive layer structure 110; in 620, providing a wafer 102, the wafer 102 including at least one electronic component 104 having at least one electronic contact 104c exposed on a first surface 102s of the wafer 102; and, in 630, adhering the wafer 102 on the carrier 106 such that the at least one electronic contact 104c of the electronic component 104 may be aligned with the contact structure 108 of the carrier 106 so that by applying a mechanical load 105d on the wafer 102, the contact structure 108 of the carrier 106 can be brought into electrical contact with the at least one electronic contact 104c of the electronic component 104.

FIG. 7 shows a schematic flow diagram of a method 700 for testing a wafer 102, according to various embodiments, the method 700 may include: in 710, providing a wafer arrangement 100, as described before; in 720, pressing at least a part of the wafer 102 in direction of the carrier 106, thereby providing an electrical contact between the contact structure 108 of the carrier 106 and the at least one electronic contact 104c of the electronic component 104 of the wafer 102; and, in 730, performing an electrical test of the electronic component 104 via the contact structure 108 of the carrier 106. Thereby, the provided wafer arrangement 100 may include: a wafer 102 including at least one electronic component 104 having at least one electronic contact 104c exposed on a surface 102s of the wafer 102; an adhesive layer structure 110 disposed over the surface 102s of the wafer 102, the adhesive layer structure 110 covering the at least one electronic contact 104c; a carrier 106 adhered to the wafer 102 via the adhesive layer structure 110, wherein the carrier 106 may include a contact structure 108 at a first surface 106s of the carrier 106 aligned with the at least one electronic contact 104c so that by pressing the wafer 102 in direction of the carrier 106, the contact structure 108 can be brought into electrical contact with the at least one electronic contact 104c of the electronic component 104.

According to various embodiments, the method 600 for manufacturing a wafer arrangement and the method 700 for testing a wafer may be performed or may be adapted as described before referring to the wafer arrangement 100.

According to various embodiments, a wafer arrangement 100 may include: a wafer including at least one electronic component having at least one electronic contact exposed on a surface of the wafer; an adhesive layer structure disposed over the surface of the wafer, the adhesive layer structure covering the at least one electronic contact; a carrier adhered to the wafer via the adhesive layer structure, wherein the carrier may include a contact structure at a surface of the carrier aligned with the at least one electronic contact so that by pressing the wafer in direction of the carrier, the contact structure can be brought into electrical contact with the at least one electronic contact of the electronic component.

According to various embodiments, the carrier material of the carrier may be transparent for an electromagnetic radiation, e.g. for ultra-violet (UV)-light.

According to various embodiments, the contact structure may include one or more contacts protruding from the surface of the carrier, the surface of the carrier facing the wafer.

According to various embodiments, the contact structure may include one or more contacts extending through the carrier from the surface of the carrier to an opposite surface of the carrier, e.g. from a first surface of the carrier facing the wafer to a second surface of the carrier facing away from the wafer.

According to various embodiments, the contact structure may be partially embedded in the carrier.

According to various embodiments, the contact structure may include one or more holes extending through the carrier from the surface of the carrier to an opposite surface of the carrier (e.g. from a first surface of the carrier facing the wafer to a second surface of the carrier facing away from the wafer), wherein the one or more holes may be filled with an electrically conductive material.

According to various embodiments, the contact structure may include one or more holes extending through the carrier from the first surface of the carrier to a second surface of the carrier opposite to the first surface of the carrier, wherein the one or more holes are filled with an electrically conductive material.

According to various embodiments, the one or more holes may be filled with at least one material of the following group of materials, the group including: tungsten, titanium, titanium nitride, tantalum, and steel.

According to various embodiments, the contact structure may include a wiring structure embedded in the carrier; the wiring structure may include an electrically conductive material.

According to various embodiments, the wiring structure may include a first wiring and a second wiring, wherein the first wiring may be electrically isolated from the second wiring.

According to various embodiments, the contact structure may include a first set of contacts and a second set of contacts respectively protruding from the surface of the carrier, wherein the first set of contacts may be electrically coupled to the first wiring and the second set of contacts may be electrically coupled to the second wiring.

According to various embodiments, the adhesive layer structure may include electrically insulating glue.

According to various embodiments, a method for processing a wafer may include: providing a carrier, the carrier including a contact structure at a first surface of the carrier, the contact structure being covered by an adhesive layer structure; providing a wafer, the wafer including at least one electronic component having at least one electronic contact exposed on a first surface of the wafer; and adhering the wafer on the carrier such that the at least one electronic contact of the wafer is aligned with the contact structure of the carrier so that by applying a mechanical load on the wafer, the contact structure of the carrier can be brought into electrical contact with the at least one electronic contact of the electronic component.

According to various embodiments, providing a carrier may include covering the first surface of the carrier and the contact structure of the carrier with at least one layer including electrically insulating glue, the electrically insulating glue providing the adhesive layer structure.

According to various embodiments, the first surface of the wafer being in contact with the adhesive layer structure may be readily processed before being adhered to the adhesive layer structure.

According to various embodiments, the method for processing a wafer may further include: processing a second surface of the wafer opposite to the first surface of the wafer after the wafer is adhered to the carrier.

According to various embodiments, the method for processing a wafer may further include: subjecting at least a part of the wafer to a mechanical load, thereby electrically connecting the at least one contact of the electronic component to the contact structure of the carrier.

According to various embodiments, the method for processing a wafer may further include: electrically testing the electronic component of the wafer by providing at least one of an electrical current and an electrical voltage to the electronic component via the contact structure of the carrier after subjecting at least a part of the wafer to the mechanical load. According to various embodiments, electrically testing the electronic component of the wafer may include providing a test signal to the electronic component 104 and/or receiving a response test signal from the electronic component 104.

According to various embodiments, the method for processing a wafer may further include: removing the wafer from the carrier via chemically influencing the adhesive layer structure. According to various embodiments, chemically influencing may include solving the glue, deactivating the glue, and/or curing the glue.

According to various embodiments, the method for processing a wafer may further include: removing the wafer from the carrier via subjecting the adhesive layer structure to an electromagnetic radiation, e.g. UV-light.

According to various embodiments, the method for processing a wafer may further include: removing the wafer from the carrier via subjecting the adhesive layer structure to an electromagnetic radiation, e.g. UV-light. According to various embodiments, the method for processing a wafer may further include: removing the wafer from the carrier via curing the adhesive layer structure via UV-light and, e.g. subsequently, mechanically removing the wafer from the carrier.

According to various embodiments, the method for processing a wafer may further include: cleaning the carrier after the wafer has been removed from the carrier to remove the remaining adhesive layer structure from the carrier.

According to various embodiments, the method for processing a wafer may further include: thinning the wafer after the wafer has been adhered to the carrier.

According to various embodiments, a method for testing a wafer may include: providing a wafer arrangement, the wafer arrangement including: a wafer including at least one electronic component having at least one electronic contact exposed on a surface of the wafer; an adhesive layer structure disposed over the surface of the wafer, the adhesive layer structure covering the at least one electronic contact; a carrier adhered to the wafer via the adhesive layer structure, wherein the carrier may include a contact structure at a first surface of the carrier aligned with the at least one electronic contact so that by pressing the wafer in direction of the carrier, the contact structure can be brought into electrical contact with the at least one electronic contact of the electronic component; and further, pressing at least a part of the wafer in direction of the carrier, thereby providing an electrical contact between the contact structure and the at least one electronic contact of the electronic component; and performing an electrical test of the electronic component via the contact structure of the carrier.

According to various embodiments, an arrangement for processing a wafer may include: a carrier including a contact structure at a first surface of the carrier; an adhesive layer structure including at least one electrically isolating adhesive disposed at least partially over a surface of the carrier, the adhesive covering the contact structure; a wafer adhered to the carrier via the adhesive layer structure, wherein the wafer may include at least one electronic component having at least one exposed electronic contact, wherein the at least one exposed electronic contact is aligned with the contact structure so that by applying a mechanical load on the wafer, the contact structure of the carrier can be brought into electrical contact with the at least one electronic contact of the wafer.

According to various embodiments, a method for processing a wafer may include: mounting a wafer on a wafer carrier, the wafer carrier including: a layer disposed over a first surface of the wafer carrier, the layer including an electrically insulating flexible material; a contact structure protruding from the first surface of the wafer carrier extending into the flexible material of the layer, wherein the contact structure is covered by the flexible material of the layer such that a wafer being arranged over the flexible layer is electrically isolated from the contact structure, and such that the wafer electrically connects to the contact structure if the wafer and the wafer carrier are pressed together; and further, processing the wafer; pressing the wafer on the carrier to electrically connect the wafer to the contact structure of the carrier; and electrically testing the wafer being in contact with the wafer carrier via the wafer carrier.

According to various embodiments, the wafer may be grinded after being mounted on the carrier, such that the thinned wafer may be carried (supported) by the carrier.

According to various embodiments, the carrier may include two carrier contacts 108s, 108g for each electronic component 104 to be connected to. According to various embodiments, the wafer may include a plurality of electronic components 104, e.g. more than ten, more than 20, more than 50, or more than 100 electronic components 104.

According to various embodiments, the carrier may be manufactured for example by ceramic injection molding, wherein a ceramic material, e.g. as powder, may be injected into a mold and wherein the contact structure 108 may be positioned within the mold while injecting the ceramic material. The arrangement including the ceramic material and the contact structure 108 may be sintered afterwards.

According to various embodiments, the carrier may include an embedded wafer level ball grid array being configured to provide the carrier and the contact structure 108 as described before.

According to various embodiments, the adhesive layer structure 110 may be configured to be temperature stable, e.g. up to temperatures of about 200° C., or e.g. up to temperatures of about 300° C., or e.g. up to temperatures of about 400° C., or even up to higher temperatures. According to various embodiments, the carrier and the contact structure may be configured to be temperature stable, e.g. up to temperatures of about 200° C., or e.g. up to temperatures of about 300° C., or e.g. up to temperatures of about 400° C., or even up to higher temperatures.

According to various embodiments, the material of the carrier may be selected to match or substantially match the coefficient of thermal expansion of the wafer.

According to various embodiments, the wafer may not directly contact the carrier while being mounted on the carrier, for example the electronic contact of the electronic component may contact the contact structure of the carrier.

According to various embodiments, the part of the contact structure 108 protruding from the surface of the carrier may have a conical shape, or a truncated shape. This shape may be formed by performing a chemical mechanical polishing of the surface of the carrier.

According to various embodiments, the adhesive layer structure 110 may include a first adhesive layer being in contact with the wafer and a second adhesive layer being in contact with the carrier. The first adhesive layer may include a light-to-heat-conversion release coating (LTHC) and the second adhesive layer may include another adhesive (e.g. a light cured liquid adhesive), e.g. such that the wafer may be removable via subjecting the LTHC to light, e.g. using a laser illumination device providing UV-light with a sufficient high intensity.

According to various embodiments, the wafer arrangement may be handled similar to a 3M™ Wafer Support System process flow. The process flow for bonding may include spin-coating a 3M™ Liquid UV-Curable Adhesive onto the wafer; subsequently, vacuum-bonding the wafer to the carrier, wherein the carrier has been coated with an 3M™ Light-To-Heat Conversion (LTHC) coating; and, subsequently, the adhesive may be cured via UV light. After the wafer has been bonded to the carrier, the wafer may be thinned using a standard back grinding process or thinning process, and subsequently the wafer may be processed using semiconductor technology. After the wafer processing has been finished, a dicing tape may be applied to the exposed surface of the wafer facing away from the carrier. Subsequently, the wafer may be debonded from the carrier if desired, e.g. after the testing of the wafer has been performed. The process flow for debonding may include: performing a laser debonding by subjecting the LTHC coating to light, and subsequently, separating the carrier from the wafer. The wafer may be adhered to the dicing tape at this processing stage being covered with the cured adhesive layer. The carrier may be cleaned and may be used again. The cured adhesive may be removed from the surface of the wafer, e.g. via a 3M™ Wafer De-Taping Tape 3305 to peel the UV adhesive.

According to various embodiments, the wafer arrangement handling may include any other suitable thin wafer handling technology.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A wafer arrangement, comprising:
   a wafer comprising at least one electronic component having at least one electronic contact exposed on a surface of the wafer;

an adhesive layer structure disposed over the surface of the wafer, the adhesive layer structure covering the at least one electronic contact; wherein the adhesive layer structure comprises an electrically insulating glue; and a carrier adhered to the wafer via the adhesive layer structure, wherein the carrier comprises a contact structure at a surface of the carrier aligned with the at least one electronic contact; wherein the at least one electronic component is resiliently structurally-biased in an insulated position and is configured to be selectively displaced into a contacted position and is further configured to revert to the insulated position after being selectively displaced.

2. The wafer arrangement according to claim 1,
wherein the contact structure comprises one or more contacts protruding from the surface of the carrier.

3. The wafer arrangement according to claim 1,
wherein the contact structure is partially embedded in the carrier.

4. The wafer arrangement according to claim 1,
wherein the contact structure comprises one or more holes extending through the carrier from the surface of the carrier to another surface of the carrier opposite to the surface of the carrier, wherein the one or more holes are filled with an electrically conductive material.

5. The wafer arrangement according to claim 4,
wherein the one or more holes are filled with at least one material of a group of materials consisting of: tungsten; titanium; titanium nitride; tantalum; and steel.

6. The wafer arrangement according to claim 1,
wherein the contact structure comprises a wiring structure embedded in the carrier;
wherein the wiring structure comprises an electrically conductive material.

7. The wafer arrangement according to claim 6,
wherein the wiring structure comprises a first wiring and a second wiring;
wherein the first wiring is electrically isolated from the second wiring.

8. The wafer arrangement according to claim 7,
wherein the contact structure comprises a first set of contacts and a second set of contacts respectively protruding from the surface of the carrier, wherein the first set of contacts is electrically coupled to the first wiring and the second set of contacts is electrically coupled to the second wiring.

9. A method for testing a wafer, the method comprising:
providing a wafer arrangement, the wafer arrangement comprising:

a wafer comprising at least one electronic component having at least one electronic contact exposed on a surface of the wafer;

an adhesive layer structure disposed over the surface of the wafer, the adhesive layer structure covering the at least one electronic contact;

wherein the adhesive layer structure comprises an electrically insulating glue;

a carrier adhered to the wafer via the adhesive layer structure, wherein the carrier comprises a contact structure at a surface of the carrier aligned with the at least one electronic contact; wherein the at least one electronic component is resiliently structurally-biased in an insulated position and is configured to be selectively displaced into a contacted position;

displacing the selected at least one electronic component into the contacted position, wherein the selected at least one electronic component reverts to the insulated position after the displacing the selected at least one electronic component into the contacted position; and performing an electrical test of the at least one electronic component via a testing device electrically coupled to the contact structure of the carrier during the displacing the selected at least one electronic component into the contacted position.

10. A wafer arrangement, comprising:
a wafer comprising at least one electronic component having at least one electronic contact exposed on a surface of the wafer;

an adhesive layer structure disposed over the surface of the wafer, the adhesive layer structure covering the at least one electronic contact wherein the adhesive layer structure comprises an electrically insulating glue; and a carrier adhered to the wafer via the adhesive layer structure, wherein the carrier comprises a contact structure at a surface of the carrier aligned with the at least one electronic contact wherein the at least one electronic component is resiliently structurally-biased in an insulated position and is configured to be selectively displaced into a contacted position, wherein the contacted position contacts the at least one electronic contact with the contact structure; and wherein the adhesive layer structure is resiliently displaced in the contacted position and reverts position after the at least one electronic component is selectively displaced.

11. The wafer arrangement according to claim 1,
wherein the adhesive layer structure is elastic.

* * * * *